United States Patent [19]

Moslehi

[11] Patent Number: 5,049,816
[45] Date of Patent: Sep. 17, 1991

[54] SEMICONDUCTOR SUBSTRATE MINORITY CARRIER LIFETIME MEASUREMENTS

[75] Inventor: Mehrdad M. Moslehi, Dallas, Tex.

[73] Assignee: Texas Instruments Incorporated, Dallas, Tex.

[21] Appl. No.: 532,284

[22] Filed: May 31, 1990

[51] Int. Cl.$^5$ .............................................. G01R 31/26
[52] U.S. Cl. .............................. 324/158 D; 324/158 T
[58] Field of Search ............ 324/158 D, 158 R, 158 T

[56] References Cited

U.S. PATENT DOCUMENTS

| 3,939,415 | 2/1976 | Terasawa ........................ 324/158 D |
| 4,839,588 | 6/1989 | Jantsch et al. ................... 324/158 D |
| 4,885,534 | 12/1989 | Eck et al. ........................ 324/158 D |

FOREIGN PATENT DOCUMENTS 61-174733  8/1986  Japan .............................. 324/158 D

OTHER PUBLICATIONS

Edward Yang, "Nonequilibrium Characteristics of Semiconductors", Fundamentals of Semiconductor Devices, McGraw Hill Book Company, 1978 pp. 32–41.
A. Grove, "Origin of Recombination–Generation Centers", from Physics and Technology of Semiconductor Devices, John Wiley & Sons, Publishers, 1967, pp. 140–145.

Primary Examiner—Ernest F. Karlsen
Attorney, Agent, or Firm—James C. Kesterson; James T. Comfort; Melvin Sharp

[57] ABSTRACT

A sensor system (50) for measurements of semiconductor wafer minority carrier lifetime. The sensor (50) includes a microwave source (78) for generating a plurality of microwave signals and a waveguide (52) for emitting the microwave signals in the direction of the semiconductor wafer (20) in a processsing chamber (18). A collector waveguide (84) detects the reflected microwave signals from the semiconductor wafer (20) and directs the microwave signals to and from the emitter waveguide (52) so as to generate a plurality of electrical signals relating to semiconductor wafer (20) physical properties. A photon energy source (102) intermittently emits photon energy in the direction of the semiconductor wafer (20). Based on the differing microwave reflectance measurements following the injection and removal of photon energy, process control computer (76) calculates semiconductor substrate physical characteristics. These physical characteristics include semiconductor minority-carrier lifetime, electrical conductivity, doping level, and temperature.

47 Claims, 6 Drawing Sheets

SEMICONDUCTOR SUBSTRATE MINORITY CARRIER LIFETIME MEASUREMENTS

NOTICE: The U. S. Government has a paid-up license in this invention and the right in limited circumstances to require the patent owner to license others on reasonable terms as provided for by the terms of a contract with the United States Air Force under the program name MMST.

TECHNICAL FIELD OF THE INVENTION

The present invention generally relates to semiconductor substrate minority carrier lifetime measurements, and more particularly to a noninvasive method and apparatus for in-situ measuring of semiconductor wafer conductivity and minority carrier lifetime.

BACKGROUND OF THE INVENTION

Integrated circuit chip manufacturers fabricate semiconductor devices using wafers of a semiconductor material such as silicon. In fabricating a semiconductor device, it is essential to minimize incorporation of unwanted impurities and crystal damage into the semiconductor substrate. In silicon integrated circuit chip manufacturing process, manufacturers purposefully dope the pure semiconductor substrate with elements such as boron or phosphorus to form current rectifying semiconductor junctions and to permit the wafer to conduct an electric current.

To insure that the semiconductor wafers possess and maintain necessary substrate purity during the device manufacturing sequence, part of the manufacturing process is to clean the surfaces of the semiconductor wafers to remove any unwanted organic, metallic, or native oxide contaminants. Moreover, some fabrication process techniques, such as reactive-ion etching (RIE) and electron-beam or X-ray lithography, can cause damage to the crystal lattice on the surface and in the bulk of semiconductor wafers. Various processes, such as RIE and ion implantation, may also introduce metallic contaminants into semiconductor wafers. The introduction of lattice damage and metallic contaminants degrade device performance and long-term reliability. The device performance degradations caused by lattice damage and metallic impurities include excessive electrical current leakage in rectifying semiconductor PN junctions and poor transistor gain.

Known methods for cleaning semiconductor wafers to remove metallic, organic and native oxide contaminants entail placing the semiconductor wafers in a dry cleaning reactor to remove these contaminants. These reactors are typically vacuum tight chambers, such as those called automatic vacuum processors (AVPs). In an AVP, the semiconductor wafer normally rests face downward (or upward) on support pins. During the process, a lamp or some other heat source, such as a heating susceptor, raises the wafer temperature to cause the wafer to react with cleaning gases or vapors. The cleaning gases expunge impurities from the surface and from within the bulk of the semiconductor wafer.

The presence of metallic impurities and crystal lattice damage on the surface and in the bulk of a semiconductor wafer can be detected as a reduction of the excess minority carrier lifetime in the semiconductor substrate. This phenomenon is caused by generation of various trap-related deep energy levels into the forbidden gap of the semiconductor energy band which facilitate or enhance the recombination of excess carriers between conduction band and valence band.

Conventional methods of measuring substrate carrier lifetime include measuring the wafer off-line after a fabrication process ends. Thence, the manufacturer removes the semiconductor wafer from the processing chamber to directly measure whether the substrate quality as specified by minority carrier lifetime meets the necessary physical specifications for its design application. Such methods of determining semiconductor substrate purity and quality, therefore, both are non-real-time and ex situ. y)An example of a technique used for substrate minority carrier lifetime measurement is the pulsed capacitance-voltage (C-V) measurement method. This type of measurement requires fabrication of metal-oxide-semiconductor (MOS) devices on semiconductor substrate and only provides the minority-carrier lifetime for the near-surface region. Therefore, these non-real-time ex-situ measurements method have little real-time process control and equipment diagnostic value to the manufacturer.

To determine accurately the semiconductor substrate crystal quality and purity in situ and during a device fabrication process sequence can significantly improve the ability to produce semiconductor devices having desirable performance and reliability characteristics. Similarly, and in the case of silicon wafers containing dopants, to know the level of doping and substrate lifetime during a device fabrication process step such as dry cleaning can ensure that the process step proceeds properly. A need exists, consequently, for a method and apparatus for making in-situ semiconductor wafer substrate lifetime, doping level, and temperature measurements during a wafer processing step.

GROVE, *PHYSICS AND TECHNOLOGY OF SEMICONDUCTOR DEVICES*, pp. 140–145, and YOUNG, *FUNDAMENTALS OF SEMICONDUCTOR DEVICES*, pp. 32–41, discuss the nonequilibrium generation and recombination characteristics of free carriers in semiconductors and the relationships between the lifetime of free excess minority charge carriers such as electrons or holes in silicon and the presence of impurities and substrate crystal lattice damage. Impurities include presence of various unwanted contaminants such as metal atoms. External affects include electron beam, x-ray, or deep ultraviolet light irradiation damage and surface states. These references explain that the presence of impurities and the injection of radiation, for example, photon irradiation, can materially change the transient electrical conductivity properties of semiconductor materials.

Young, in particular, shows the physical meaning of carrier lifetime by explaining the transient conductivity response of a piece of silicon to the initial presence and subsequent rapid removal of photon energy from the surface of a silicon substrate. YOUNG, pp. 39–41. That experiment shows that upon a sudden illumination of photon energy (with incident photon energies higher than the semiconductor bandgap energy of 1.1 eV for silicon) the silicon conductivity rapidly increases to a higher level due to generation of excess electron-hole pairs in the substrate. Upon a sudden removal of the photon energy, the substrate conductivity decays to its original thermal equilibrium level. The rate of transient conductivity decay of the silicon depends on the carrier lifetime.

If a non-invasive apparatus and system existed that could measure the conductivity decay and minority carrier lifetime in situ within a semiconductor processing reactor, then such a system could determine the presence of metallic impurities or other external affects such as irradiation damage during a fabrication process. A good example of an application is a dry cleaning reactor (such as a photochemical reactor for removal of metallic/organic/native oxide contaminants) where a noninvasive minority carrier lifetime sensor can be used (either in the vacuum load-lock or in the cleaning process chamber) to monitor the effectiveness of the cleaning processes.

Thus, there is the need for an apparatus and system that can measure semiconductor substrate conductivity and minority carrier lifetime for the purpose of determining substrate purity and quality, doping level, as well as temperature during a semiconductor device fabrication process.

SUMMARY OF THE INVENTION

A related patent application Ser. No. 503,005, *Measurement of Conductive Layers in a Semiconductor Wafer* by Moslehi (inventor of the present invention) and filed Mar. 31, 1990, demonstrates the use of a microwave sensor system for real-time in-situ semiconductor wafer conductive layer measurements in a chemical-vapor deposition, sputtering, or plasma etch chamber. The above-identified patent application is hereby incorporated by reference herein. The sensor of that invention includes a low-power high-frequency electromagnetic microwave source that generates and transmits electromagnetic waves via an emitter waveguide. The emitter waveguide emits microwave power via its open end or a small microwave antennae in the direction of a semiconductor wafer within the deposition or etch chamber. Microwave detection circuitry and a computer of that invention receive and convert the electromagnetic energy that the semiconductor wafer reflects into the physical properties of the conductive layer and semiconductor wafer.

According to one aspect of the present invention, the sensor system incorporates a similar sensor system together with an oscillating photon energy source (such as a plasma light source or a light-emitting diode, (LED)) and more computer processing capability to provide a sensor for noninvasive in-situ (as well as real-time in-situ) semiconductor wafer substrate carrier lifetime measurements. In the present invention the microwave detection circuitry and process control computer receive and convert the signals representing electromagnetic energy that the semiconductor wafer reflects into silicon substrate carrier lifetime measurements and other measurements pertaining to the physical properties of the semiconductor wafer (substrate conductivity and temperature).

Another aspect of the present invention includes a sensor for noninvasive in-situ (as well as real-time in-situ) semiconductor wafer substrate carrier lifetime measurements. An electromagnetic wave source generates a plurality of electromagnetic waves scanned in time over a of frequencies, such as in the range of 12-18 GHz. An emitter waveguide within the wafer processing chamber receives the plurality of electromagnetic waves from the electromagnetic wave source and emits the electromagnetic waves in the direction of the semiconductor wafer. The semiconductor wafer, located a short distance from and out of contact with the emitter waveguide, receives and reflects a portion of the electromagnetic waves. A receiver waveguide detects a fraction of the reflected electromagnetic waves from the semiconductor wafer. A lamp source radiates chopped photon energy on the surface of the semiconductor wafer. A receiver waveguide detects the reflected electromagnetic waves from the semiconductor wafer.

A technical advantage of the invention is that it makes possible real-time process control and diagnostics. Because the method and apparatus are non-invasive, and in situ (and can also be made real-time), a process control computer can convert measured signals to semiconductor wafer physical properties and make continuous process parameter adjustments during a device fabrication process.

Yet another technical advantage is that a manufacturer can implemented the present invention in a vacuum load-lock or a metrology chamber adjacent to an AVP or similar vacuum integrated wafer processing platform. The load-lock is a compartment adjacent to the process chamber of a semiconductor processing reactor that receives and holds semiconductor wafers both prior to and after a wafer processing step. By applying the present invention to wafers in the load-lock, room temperature measurements of wafer parameters such as carrier lifetime are possible that otherwise may be disturbed by relatively high process temperatures used in some deposition and anneal equipment.

BRIEF DESCRIPTION OF THE DRAWINGS

The invention itself and modes of use and further advantages is best understood by reference to the following description of illustrative embodiments when read in with the accompanying drawings.

DETAILED DESCRIPTION OF THE INVENTION

Figure 1:
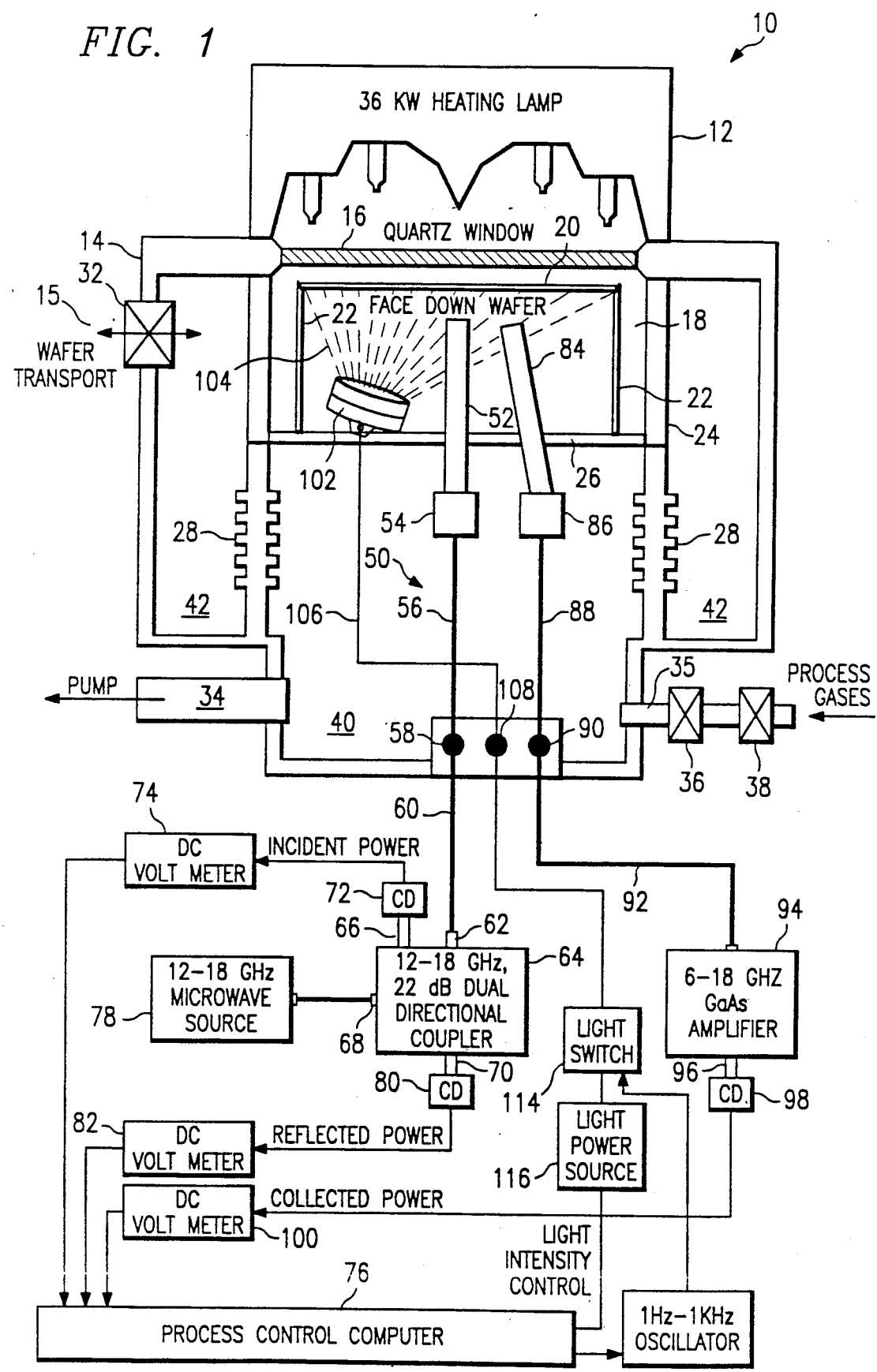
FIG. 1 is a diagrammatic, partially broken-away view of a preferred embodiment of the non-invasive sensor for real-time in-situ semiconductor wafer substrate carrier lifetime measurements within a semiconductor processing chamber.

The preferred embodiment of the present invention is best understood by referring to the drawings, like numerals being used for like and corresponding parts of the various drawings.

FIG. 1 shows a diagrammatic, partially brokenaway view of a lamp heated wafer processing reactor apparatus that employs a preferred embodiment of the present invention. Semiconductor processing apparatus 10 comprises heating lamp 12 for generating process heat energy and vacuum-tight casing 14 in which process chamber collar 24 is located and in which the device fabrication process occurs. Vacuum-tight casing 14 comprises a quartz window 16 for transmitting the wafer heating energy into process chamber 18 onto wafer 20. Within process chamber 18, a semiconductor wafer 20 sits, usually face down, on three or four low thermal mass quartz pins 22. Process chamber 18 includes process chamber collar 24 and base support or counter electrode 26. Base support 26 connects to process chamber collar 24 and supports low thermal mass pins 22. Bellows 28 supports process chamber 18 and translates process chamber 18 vertically to allow for wafer handling and transfer between the vacuum load lock chamber 15 and the process chamber 18 via isolation gate 32.

Semiconductor process apparatus 10 further comprises isolation gate valve 32 as part of vacuum-tight casing 14 for interaction between vacuum load lock chamber 15 (not shown) and process chamber 18, and for inserting and removing semiconductor wafer 20. Pumping mechanism 34 attaches to vacuum-tight process chamber 18 for pulling vacuum on the processing apparatus 10. Gas inlet line 35 is usually connected to a gas mixing manifold (not shown) and includes toggle valve 36 and needle valve or mass-flow controller 38 that permit semiconductor wafer process gases to enter semiconductor processing apparatus 10. Translation compartment 40 receives semiconductor wafer processing gases and provides support for process chamber 18 to vertically translate within semiconductor wafer processing apparatus 10 in response to raising and lowering bellows 28 during semiconductor wafer handling.

The microwave sensor portion of the present invention appears in FIG. 1 as non-invasive sensor system 50 within semiconductor processing apparatus 10. Emitter waveguide 52 protrudes through base support 26 along the vertical central axis of process chamber 18 and emits microwave power via its open end termination or a horn antenna termination (not shown). Waveguide-to-coaxial adapter 54 connects emitter waveguide 52 to coaxial cable 56. Coaxial cable 56 passes through translation compartment 40 via vacuum coaxial feedthrough 58 at the lower section of vacuum-tight casing 14. Coaxial cable 60 begins at vacuum feedthrough 58 and connects to output emitter port 62 of dual-directional coupler 64.

Dual-directional coupler 64 includes emitter crystal detector port 66 for incident microwave power measurement, microwave source port 68, and detector crystal detector port 70 for reflected power measurement in transmitting waveguide arm 52. Emitter crystal detector port 66 connects to emitter crystal detector 72 which electrically connects to DC voltmeter (or analog-to-digital converter) 74. DC voltmeter (or analog-todigital converter) 74 directs a measurement signal representing the incident microwave power to process control computer 76. Microwave source port 68 receives a 12-18 GHz microwave signal from microwave signal source 78. Reflected power crystal detector port 70 connects to crystal detector 80 which sends a DC signal to DC voltmeter (or analog-to-digital converter) 82 representing the reflected microwave power in transmitting waveguide arm 52. DC voltmeter (or analog-to-digital converter) 82 sends a measurement signal to process control computer 76.

In the preferred embodiment, non-invasive sensor system 50 further comprises collector waveguide 84 that protrudes through base support 26 of process chamber 18 for receiving at least a portion of the signals that emitter waveguide 52 emits and that semiconductor wafer 20 reflects. Collector waveguide 84 collects the reflected microwave power via its open end termination or a horn antenna (not shown) and connects to waveguide-to-coaxial adapter 86. Coaxial cable 88 connects waveguide-to-coaxial adapter 86 to vacuum feedthrough 90. Coaxial cable 92 connects coaxial-vacuum feedthrough 90 to 6--8 GHz GaAs amplifier 94. GaAs amplifier 94 directs an amplified signal through collector crystal detector port 96 to collector crystal detector 98. Collector crystal detector 98 generates a DC voltage signal proportional to the collected microwave power and directs the signal to DC voltmeter (or analog-to-digital converter) 100. DC voltmeter (or analog-to-digital converter) 100 transmits a measurement signal to process control computer 76 representing the collected microwave power.

Chopped light source 102 is placed within the process chamber 18 or outside the process chamber and above the quartz window 16 (or to the side of process chamber wall 24) and provides photon energy to illuminate the semiconductor wafer face. The chopped light source is a fast switching light source such as a light-emitting diode (LED) or plasma lamp which can be turned on and off at a relatively high frequency (e.g. up to 100 kHz). All or at least a fraction of the lamp optical photons have energies above the semiconductor bandgap energy (1.1 eV in Si at room temperature) and result in generation of electron-hole pairs. Light source 102 connects to a fast semiconductor switch 114 such as a switching transistor which chops the lamp power supply 116 current to the lamp under computer control. Both the chopping frequency and the duty cycle of the lamp power supply control signal can be adjusted. If desired, the lamp intensity may be modulated between two different on-states without turning off the lamp during any portion of the cycle.

In the preferred embodiment, emitter waveguide 52 appears within process chamber 18 at the semiconductor wafer 20 central axis in a line nearly perpendicular with semiconductor wafer 20 and base support 26. Other locations within process chamber 18, however, are possible according to such factors as the particular configuration of process chamber 18. For example, a possible configuration may include placing emitter waveguide 52 on a side of semiconductor wafer 20 opposite that of collector waveguide 84. Factors that determine the optimal configuration include ease of sensor hardware implementation, enhanced signal-to-noise ratio, large measurement dynamic range, good response sensitivity, and negligible short-term and long-term signal drifts.

Collector waveguide 84 penetrates base support 26 a distance of 3.8 cm from the centerline of emitter waveguide 52 at an angle of less than 90° from base support 26 and in the direction of the center point of semiconductor wafer 20. During a semiconductor device fabrication process in a typical process chamber, the distance between semiconductor wafer 20 and base support 26 is 10.4 cm. The preferred embodiment of the present invention uses a distance of approximately 30 mm between emitter waveguide 52 and semiconductor wafer 20. This distance optimizes not only the microwave incidence and collection, but also the sensor sensitivity for silicon semiconductor substrate lifetime measurements and profiling. Distances much shorter than 30 mm cause the sensor to be invasive to the process; greater distances than 30 mm can be used; however, very large distances may reduce the detector's sensitivity and response. The optimized positions of waveguides, however, depend on the configuration and design of the semiconductor process chamber. Distances between emitter waveguide 52 and semiconductor wafer 20 may vary, however, depending on other factors including the microwave frequency and angle of incidence.

Depending upon the desired microwave frequency for the emitter, the present invention may use any one of a number of possible microwave transmitters. Known microwave transmitters operate in various bands including those in the ranges of 15.0 to 18.0 GHz or 12.4 to 18.0 GHz range. These transmitters are sufficient for the purposes of the present invention.

Lamp source 102 in the preferred embodiment, is a low power cold light source, such as an LED or a plasma light source, that generates photon energy in the direction of semiconductor wafer 20. Lamp source 102 mounts within or outside the process chamber 18 to irradiate the semiconductor wafer 20. Light source 102 of the preferred embodiment, shines a broadly dispersed beam of light on the face of semiconductor wafer 20. The photon energies that lamp source 102 emits are large enough to be absorbed near the surface of semiconductor wafer 20 and generate excess electron-hole pairs within the substrate by direct band-to-band photon absorption.

Emitting photons with energies larger than the semiconductor wafer bandgap energy to the face of semiconductor wafer 20 produces excess electron-hole pairs near the semiconductor substrate surface. In essence, the photons interact with the semiconductor substrate and cause upward transition of electrons into the conduction bands leaving excess free holes behind in the valence band. The photo-generated electrons in the conduction band and the free holes in the valence band contribute to the overall electrical conductivity in the semiconductor substrate. Intensity of lamp source 102 is not particularly very critical, except that it should be large enough to cause a measurable substrate electrical conduction charge. At least a fraction of the incident photons should have energies higher than the semiconductor bandgap energy (e.g. 1.1 eV in Si). Similarly, the wavelength of the light source is not critical, provided, however, that the wavelength (for at least a fraction of the photons) should be less than a micron in the case of silicon substrate. This minimum wavelength is essential for optical generation of electron-hole pairs in silicon by direct band-to-band absorption. Higher energy photons penetrate less into the substrate and are absorbed in the near-surface region.

The number of injected carriers in a semiconductor usually has a significant impact on device performance. In a semiconductor wafer without light illumination, the material is in equilibrium and there are no excess carriers. The majority carrier density (electrons in n-type and holes in p-type materials) is equal to the doping concentration (at room temperature). After turning on the light source, two different conditions may occur. If the injected-carrier density is small relative to the doping level, the majority-carrier density remains essentially unchanged (or slightly increased) and the minority-carrier density is equal to the excess injected-carrier density. This condition is called low-level injection (LLI) under which the total conductivity of semiconductor material (due to electron and hole conductivity components) remains unchanged or slightly increased. On the other hand, if the photo-generated injected-carrier density exceeds the doping density, the condition is called high-level injection (HLI). The total carrier density is always equal to the sum of the thermal equilibrium and excess carrier densities. The minority-carrier lifetime under the LLI condition is inversely proportional to the trap concentration $N_t$ and trap capture cross section, $C_p$ or $C_n$, such that $$\tau_p = 1/(C_p N_t),$$

in n-type materials (holes), and $$\tau_n = 1/(C_n N_t),$$

in p-type materials (electrons). The general expression for excess carrier lifetime under HLI conditions are rather complicated.

In accordance with control signals from process control computer 76, light source 102 alternatingly turns on and off (or switches between two different on- states) under the control action of the computer to intermittently shine its light on semiconductor wafer 20. The length of time that the light source remains on (or at a higher intensity level) in each cycle is typically not process limiting and the on-period can be much shorter than the off-period length. However, the length of time the light source remains off is important. Depending on the purity of the semiconductor substrate, the necessary time for leaving the light source off (or at a lower intensity level) may vary. When the light source turns off (or is switched to a lower intensity level) there is an exponential decay in the number of excess photo-generated electron-hole pairs with a time constant equal to the minority carrier lifetime (assuming a low-level injection condition).

The rate of excess carrier density decay determines the lower limit for the off time for the light source. In particular, a limiting condition is that prior to turning the light source back on, the off period must be sufficiently long (e.g., at least five times the minority lifetime) to allow enough time for the electron-hole recombination process to completely take place and to allow the semiconductor substrate to return to its thermal equilibrium (or new steady-state) condition. The off-period determined by frequency of the chopped light source is automatically adjusted by the process control computed by going through an initial self-calibration routine. The on-period can remain fixed for various types of substrates. Typically, the on-period length can be in the range of 1 millisecond to 1 second. If the light intensity level during the on-period part of the chopped light cycle is very large to satisfy the high-level injection (HLI) condition, the effective time constant of the exponential decay of the excess carrier density will not be equal to the minority-carrier lifetime. However, the HLI lifetime measurements can still be used for qualitative evaluations of the substrate purity.

Possible equipment for use as the dual-directional coupler 64 includes Hewlett-Packard equipment model HP 1692D dual direction coupler together with HP 8472B crystal detectors to generate the above mentioned DC voltages. Although the preferred embodiment includes dual directional coupler 64, the invention may use one or more unidirectional couplers capable of performing the same functions as dual directional coupler 64. Directional coupler 64 communicates with the emitter arm 52 to direct the electromagnetic waves to and from the emitter and receiver waveguides and for measuring the incident and reflected microwave powers.

If desired, the sensor system 50 of the present invention can employ two collector/receiver waveguides: one collector waveguide on the same side of the semiconductor substrate as the transmitting waveguide and a second collector waveguide on the opposite side of the semiconductor wafer. Moreover, if a second collector waveguide is used on the opposite side of the semiconductor substrate, another detector signal is obtained which is a measure of microwave power transmitted through the wafer and collected by the waveguide. This signal can be fed directly to process control computer 76 for processing and semiconductor wafer 20 measurements.

Microwave source 78 determines the frequency that emitter waveguide 52 emits. According to the preferred embodiment of the present invention, the frequency should be high enough so that the microwave wavelength is short in comparison to the semiconductor wafer diameter and the reactor dimensions and so that emitter waveguide 52 can send microwave energy toward semiconductor wafer 20 as a directional beam. Also, the short microwave wavelength, relative to the dimensions of semiconductor wafer 20 (e.g. 150 mm in diameter) and process chamber 18 (which typically approximates 180-300 mm diameter) will ensure compact sensor components and enhance measurement sensitivity.

The frequency of 10 GHz has a wavelength of approximately 3 cm which is sufficiently small for this purpose. For the preferred embodiment of the invention, this establishes an approximate lower frequency limit. With frequencies much higher than 30 GHz, most of the microwave energy interaction will be with the surface layer of the semiconductor wafer. Too high frequencies such as f>30 GHz may result in smaller signal-to-noise ratios and low sensitivities for semiconductor substrate microwave reflectance measurements. Thus, a frequency of 30 GHz establishes an approximate upper frequency limit in the preferred embodiment. Microwave components for frequencies much above 30 GHz are rather expensive and will result in a high sensor cost. As a result, microwave frequencies in the range of 10-30 GHz are chosen for the sensor operation based on technical and cost reasons.

In summary, for the preferred embodiment, the microwave frequency should be between 10-30 GHz. The optimal frequency band for the present invention, however, can change according to the particular physical parameters of the semiconductor wafer (e.g., its resistivity) being measured in semiconductor process apparatus 10.

The preferred embodiment of the present invention uses a fixed frequency 12 GHz GaAs microwave oscillator as the microwave source 78. Possible components acceptable as the microwave source 78 include Models FS-1280 or FS-3081 from Loral Frequency Sources of Chelmsford, Mass. An alternative embodiment of the microwave source 78 employs frequency scanning (or adjustable frequency source) capabilities for producing frequencies of between 10 and 30 GHz. (e.g. 12-18 GHz oscillators). The use of a tunable-frequency microwave source allows depth profiling measurements of the semiconductor substrate by real-time scanning source frequency and performing the microwave reflectance and transient reflectance measurements as a function of source frequency. For instance the frequency may be modulated with a triangular waveform in order to perform scanned frequency measurements. The frequency scanning rate can be selected in a wide range (e.g., 1 Hz-100 KHz).

In an alternative embodiment of the present invention, microwave frequency source has the ability to vary or scan frequencies. Ability to scan electromagnetic signal frequencies increases the flexibility of sensor system 50. By frequency scanning within the microwave source the microwave energy can penetrate different silicon substrate depths, thereby permitting semiconductor substrate conductivity and lifetime profiling. Frequency scanning, for example, is useful in determining physical properties such as substrate lifetime or dopant levels versus depth. Semiconductor substrate profiling in this manner permits the user to identify varying regions of substrate purity, lifetime, and other physical characteristics.

In the preferred embodiment, process control computer 76 converts measured signals corresponding to the incident power, reflected power, and collected power values into substrate lifetime and substrate temperatur and/or conductivity measurements. Process control computer 76 may, for example, contain look-up tables that translate the collected microwave reflectance transient lifetime data (or, more precisely, the ratio of collected microwave power in the receiving waveguide to the transmitted microwave power in the emitter waveguide) to substrate doping level or impurity concentration characteristics. Process control computer 76 may, for example, include a program that uses look-up tables by correlating measured microwave reflectance values with known values of semiconductor wafer conductivity and substrate temperature values. These tables are also useful to determine values for substrate sheet resistance or to detect process end-point time during semiconductor wafer cleaning processes. The thermal equilibrium substrate conductivity (light source off) measurement can be used to extract substrate temperature and/or doping. Moreover, the transient conductivity measurements with chopped light source allow substrate lifetime measurements.

Process control computer 76 also controls the duty cycle of chopped lamp source 102. Controlling the lamp source 102 chopping duty cycle (and frequency) permits process control computer 102 to optimize the lamp off-period length for achieving thermal equilibrium condition at the end of each off-period segments and, as a result, perform substrate lifetime measurements.

Furthermore, process control computer 76 may control a semiconductor wafer cleaning process using the real-time in-situ measurements that sensor system 50 performs during the cleaning process. For example, suppose that during a remote plasma or photochemical cleaning process the differences between the measured substrate minority carrier lifetime and the desired target values are continuously monitored. Process control computer 76 also controls such factors such as heating lamp 14 power or cleaning gas pressure and flow, as well as process time, then process control computer 76 may accordingly terminate at an appropriate end-point time which the cleaning process yields a semiconductor wafer having the desired substrate quality or lifetime properties. In this mode of operations, the sensor is used as an end-point process monitor.

The process control tasks assisted by this sensor may include varying the flow of cleansing gases, changing the wafer temperature, or terminating the process at the proper end-point moment when the semiconductor wafer satisfies design parameters that the sensor system measures (i.e., end-point detection). This ability to monitor and/or adjust the process as it proceeds can improve significantly the semiconductor device fabrication processes and, thereby, enhance the integrated circuit chip manufacturing yield. The measured data can be used for equipment/process diagnostics and continuous optimization of the device fabrication processes. The sensor may also be used to monitor damage and contamination introduced by processes such as reactive-ion etching (RIE). In these applications, the sensor can be used for process optimization to minimize degradation of substrate quality.

Referring now to the operation of non-invasive sensor system 50, microwave source 78 generates a microwave signal and sends the signal to microwave source port 68. Dual directional coupler 64 receives the microwave signal, senses the signal, and directs it through emitter port 62 to coaxial cable 60. The microwave signal traverses coaxial cable 60, coaxial-vacuum feedthrough 58, and coaxial connector 56 to reach waveguide-to-coaxial adapter 54. Waveguide-to-coaxial adapter 54 directs the microwave signal to emitter waveguide 52. Emitter waveguide 52 emits microwave energy toward semiconductor wafer 20. Microwave energy impinges on and interacts with semiconductor wafer 20.

Semiconductor wafer 20 has a certain thermal equilibrium electrical conductivity. The semiconductor substrate doping level, purity and temperature determine the conductivity value. As a result, semiconductor wafer 20 absorbs some of the incident microwave power, allows transmission of a fraction of the microwave power, and reflects a portion of the microwave power, depending on its conductivity and thickness.

In operation of the preferred embodiment, microwave collector 84 (which can be an open-ended waveguide or a waveguide with a horn antenna termination) detects microwave power that semiconductor wafer 20 reflects. Waveguide-to-coaxial adapter 86 transmits the collected signals from microwave collector 84 into coaxial cable 88, coaxial-vacuum feedthrough 90, and coaxial cable 92 return to GaAs microwave amplifier 94. GaAs microwave amplifier 94 receives the detected signal and sends the amplified microwave signal to collector crystal detector port 96. Collector crystal detector 98 converts this microwave signal to a DC voltage signal proportional to the microwave power that DC voltmeter (or analog-to-digital converter) 100 can measure and convert to an input for process control computer 76. Dividing the collected power in the collecting waveguide 84 by transmitted power from transmitter waveguide (transmitted power = incident power minus reflected power in emitter waveguide 52) determines microwave reflectance of semiconductor wafer 20.

At the same time that dual directional coupler 64 directs microwave signals from microwave source 78 to emitter waveguide 52, dual directional coupler 64 also taps and measures the incident power of microwave signals from microwave source 78. Dual directional coupler 64 directs this measurement signal through emitter crystal detector port 66 to emitter crystal detector 72. Emitter crystal detector 72 produces a DC voltage signal proportional to the microwave power in response to this measurement. This value comprises a digital input to process control computer 76 representing the incident microwave signal power inside emitter waveguide 52.

The operation of microwave sensor 50 using the combination of non-invasive microwave reflectance measurements with chopped light source 102 makes use of the fact that when a photon source illuminates the semiconductor substrate surface, the substrate electrical conductivity increases due to photo-generation of excess electron-hole pairs. This increase in electrical conductivity affects the microwave reflectance that sensor system 50 senses. Upon the removal of photon energy from the surface of semiconductor wafer 20, the substrate conductivity begins to approach its thermal equilibrium state in the absence of the light energy source (transient reflectance decay according to the minority carrier lifetime).

Figure 2:
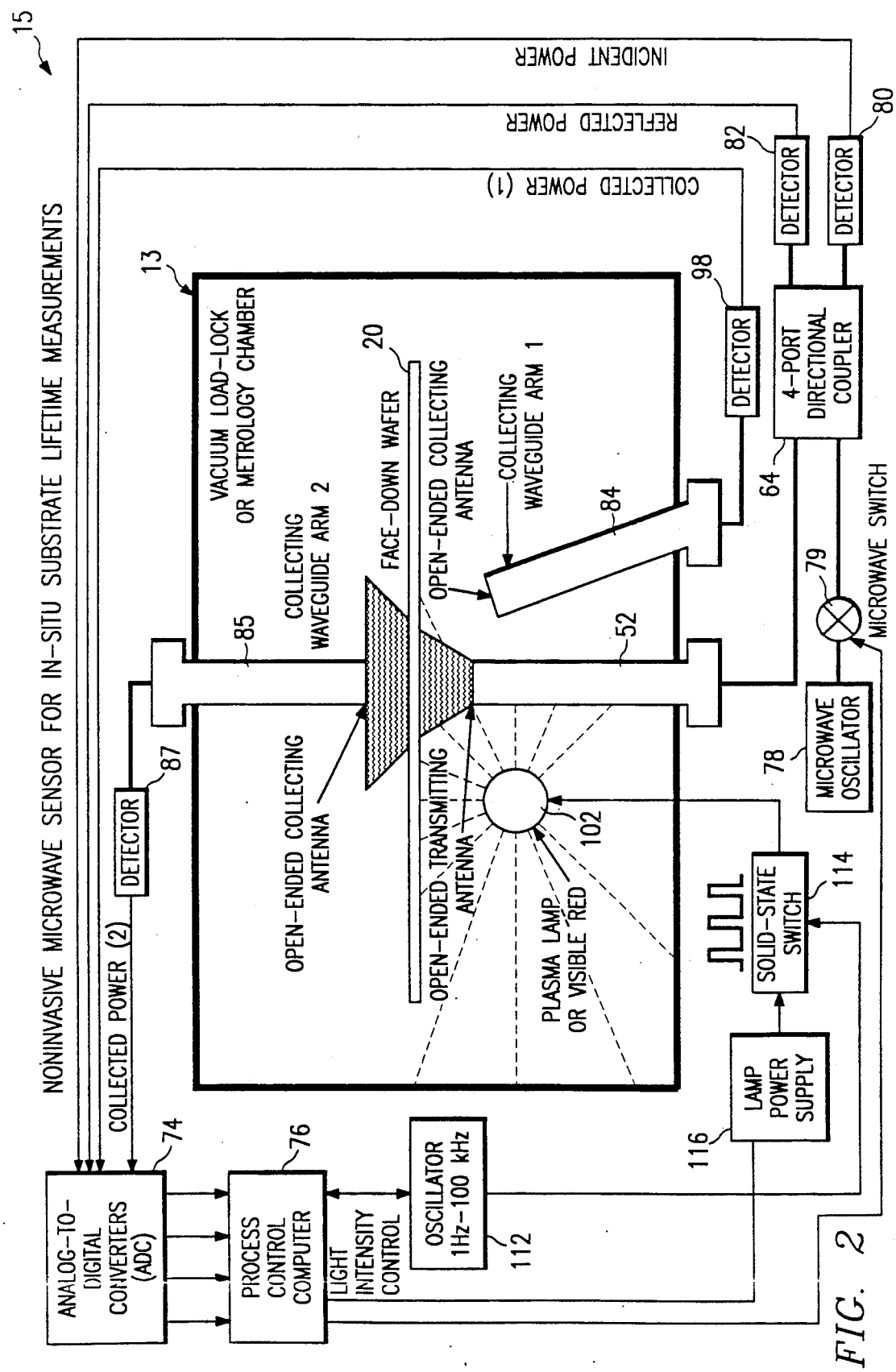
FIG. 2 shows an alternative embodiment of the present invention as it may appear in a load-lock chamber of a typical semiconductor wafer processing system.

FIG. 2 shows an alternative embodiment of the present invention as it may appear in a load-lock chamber or a sensor/metrology chamber of a vacuum-integrated processing platform. The present invention has application in such a configuration to test semiconductor wafer 20 both prior to and following a cleaning, deposition, anneal, or etch process. FIG. 2 shows semiconductor wafer 20 within load-lock or metrology chamber 15. Penetrating load-lock or metrology chamber 15 are emitter waveguide 52, collecting waveguide arm 84, and a second waveguide arm 85. Emitter waveguide 52 connects to directional coupler 64 to provide a DC voltage output through detector 72 to analog-to-digital converters 74 and, ultimately to process control computer 76. Collector waveguide 84 provides collected/reflected microwave signals to crystal detector 98 (either directly or via a microwave amplifier which is not shown in FIG. 2) which sends DC voltage electrical signals to multichannel analog-to-digital converters 74 and then on to process control computer 76.

Collector waveguide 85 provides collected/transmitted microwave signals to detector 87 either directly or via a microwave amplifier, not shown) which provides electrical DC voltage signal to analog-to-digital converter 74 and finally, to process control computer 76. Directional coupler 64 receives input from microwave oscillator 78 through microwave switch 79. Process control computer controls microwave switch 79 which can chop the microwave signal source. Similar to its position in the cleaning reactor of FIG. 1, lamp 102 mounts within load-lock chamber 13 a short distance away from semiconductor wafer 20 to provide chopped photon energy to the semiconductor wafer 20 face. Lamp power supply 116 provides power through solid-state switch 114 to intermittently power plasma lamp or LED 102. Oscillator 112 controls solid-state switch 114 and chops the light source 102 according to control signals from process control computer 76.

The operation of alternative embodiment 1 within the load-lock or metrology chamber is functionally similar to that of the configuration within process reactor 12. The operational difference of load-lock or metrology chamber implementation 11 resides in its ability to provide pre-process and post-process in-situ substrate lifetime measurements in order to monitor the effects of fabrication process on substrate quality. Additionally, alternative embodiment 11 permits testing the substrate minority carrier lifetime at room temperatures without having to disturb the wafer heating or cooling during a deposition or an etch process.

Various factors affect the rate with which the transient substrate conductivity approaches the thermal equilibrium state. For example, pure semiconductor substrates have greater minority carrier lifetime than do semiconductor substrates with impurities, such as metallic contaminants or crystal lattice damage within the substrate. Thus, with all other facts the same, the greater the substrate lifetime, the better the purity and quality of the semiconductor substrate.

The drift velocities of electrons and holes for an applied electric field within the semiconductor substrate determine the carrier mobilities within the substrate. The following equation determines the total substrate electrical conductivity within a semiconductor substrate:

$$\sigma = q\mu_n n + q\mu_p p.$$

Where $\mu_n$ and $\mu_p$ are the electron and hole mobilities in cm$^2$/V second, respectively; q is the electron charge; and n and p are the total electron and hole concentrations, respectively.

When introduced into a semiconductor substrate, certain impurities lead to trap energy levels within the forbidden gap. The forbidden gap is the energy domain between the conduction band and valence band edges of the semiconductor energy band diagram. It is the energy region in which free charged carriers cannot exist in pure semiconductor substrate. The forbidden gap is the region below the lowest energy of the conduction band and above the highest energy level of the valence band. Because typical n-type and p-type dopant elements (such as boron, arsenic, and phosphorus in silicon) behave as donors and acceptors in semiconductor lattices, the energy levels associated with them will be shallow, i.e., they will be close to the valence-band (for p-type) and conduction-band (for n-type) energies.

Figure 3:
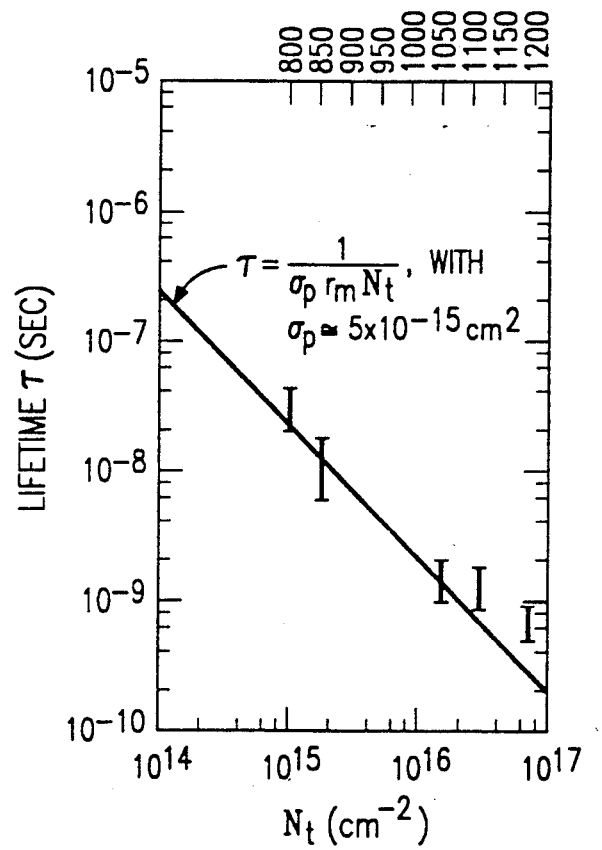
FIG. 3 shows a plot of the observed relationship between (metallic impurity) gold concentration and carrier lifetime in silicon.

GROVE, *PHYSIC and TECHNOLOGY of SEMICONDUCTOR DEVICES*, (1967), explains that the presence of unwanted impurities and lattice damage can reduce the lifetime of excess free charged carriers in silicon substrates. For example, FIG. 3, taken from GROVE, p. 142, shows a plot of the observed relationship between (metallic impurity) gold concentration and carrier lifetime in silicon. FIG. 3 shows that as the gold concentration increases, the excess minority carrier lifetime decreases.

Figure 4:
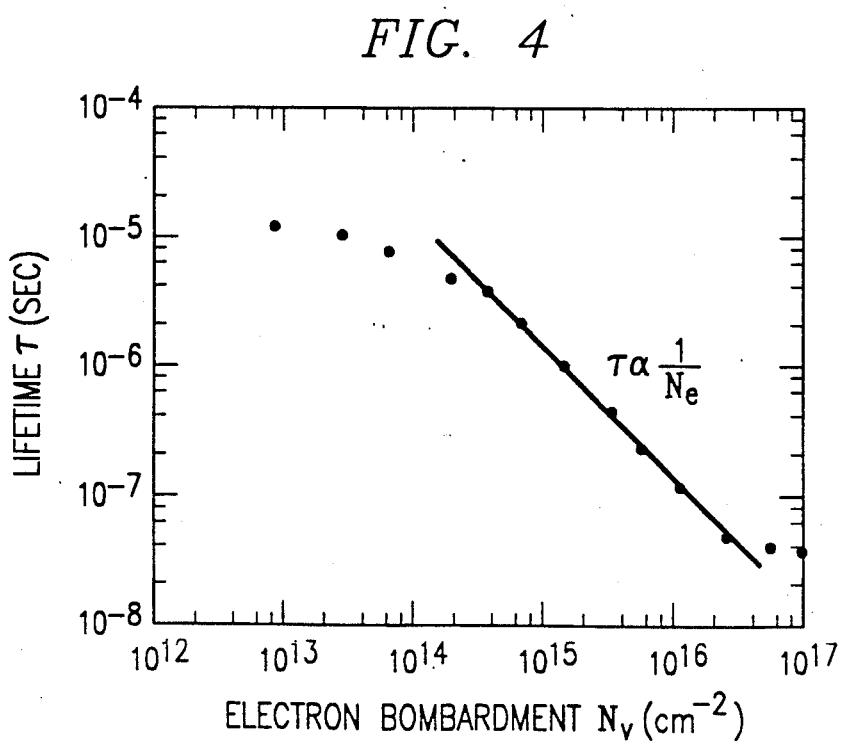
FIG. 4 shows the effect of such external conditions such as electron bombardment on the carrier lifetime of a silicon sample.

A condition that can introduce trap energy levels into the forbidden gap is the exposure of silicon to high-energy radiation—electrons, protons, gamma rays, neutrons, X-ray, or deep ultra-violet irradiation. Various types of irradiation (x-ray, electrons, high-energy photons) as well as impurities can introduce bulk and surface traps and states in a semiconductor substrate and result in a reduction of minority carrier lifetime or enhanced surface recombination velocity. The energetic particles can displace semiconductor atoms from their normal positions in the semiconductor lattice to create broken bonds, vacancies, and interstitials in the substrate. FIG. 4, also taken from GROVE, p. 143, shows the effect of such external conditions on the carrier lifetime of a silicon sample. It is these effects that the present invention offers the ability to determine. Various types of heavy metallic impurities (e.g., Au, Fe, Ni, Zn) can cause deep trap centers and degrade semiconductor device performance.

Figure 5:
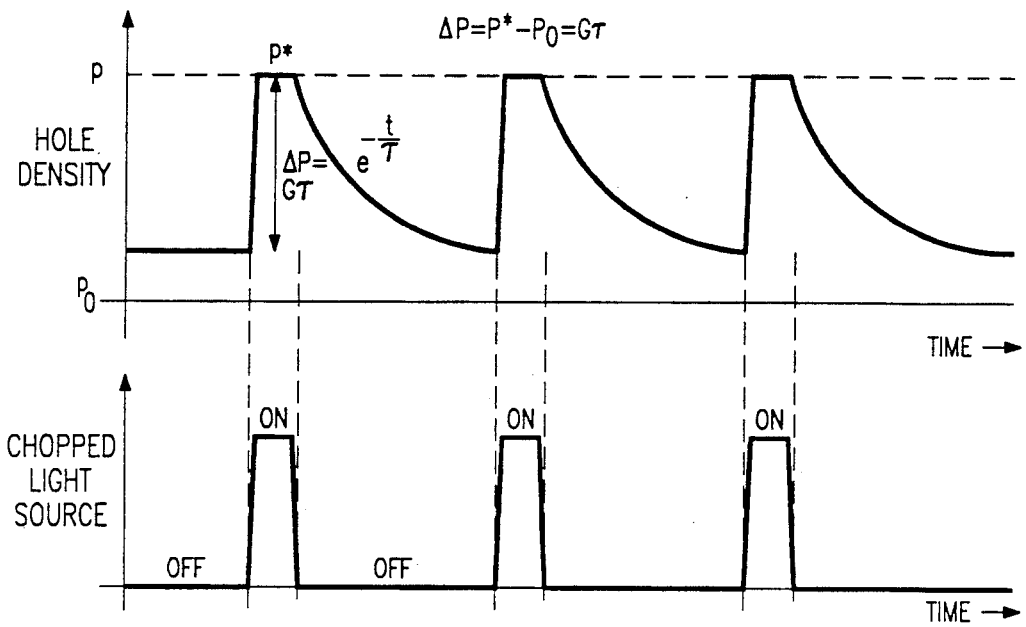
FIG. 5 shows the effect on transient semiconductor substrate hole concentration for an n-type semiconductor of chopping light source of the present invention which provides intermittent photon energy to the wafer face.

FIG. 5 shows the effect on transient semiconductor substrate hole concentration for an n-type semiconductor of chopping light source 102 with an intermittent photon energy to the wafer face. FIG. 5 shows that as light source 102 is chopped, the concentration of minority carriers (i.e., holes, p, in the case of n-type semiconductor material) increases rapidly (from $P_o$ to $P^*$) and then decreases according to the minority carrier transfer lifetime. The new equilibrium level that FIGURE 5 shows is a function of the number of photons having energies above the bandgap that the semiconductor wafer 20 face sees. The value of the new equilibrium level equal to $G\tau$, where G is the generation rate of minority carriers (proportional to the light intensity) and $\tau$ is the minority carrier lifetime. Once the light is turned off, the hole concentration decays from $P^*$ back to $P_o$ in accordance with the minority carrier transfer lifetime, $\tau$.

Figure 6:
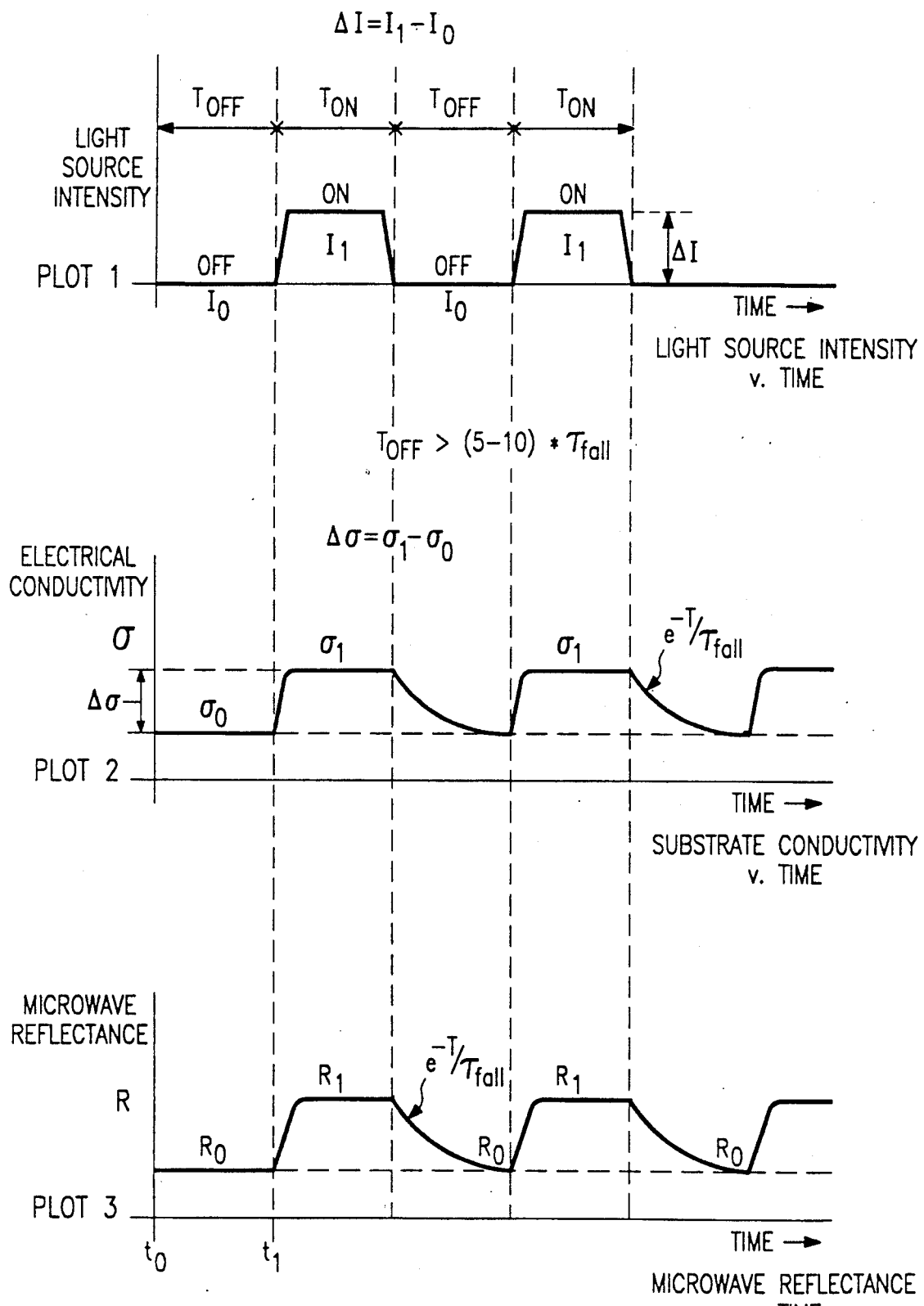
FIG. 6 is a qualitative plot of the chopped light intensity, total substrate electrical conductivity, and measured microwave reflectance vs. time for a typical semiconductor wafer substrate measurement and a preferred embodiment of present measurement.

FIG. 6 demonstrates the qualitative effects of chopped light source 102 on transient microwave reflectance measurements performed by sensor system 50. Plot 1 comprises a plot of light source intensity versus time and depicts operation of light source 102. At time $t_1$, light source 102 turns on for a duration of $T_{on}$ and then turns off. After a duration of $T_{off}$ msec, light source 102 again turns on, and this chopping process continues as sensor system 50 measures microwave reflectance. The precise amount of light intensity during the on periods is not generally critical, provided however, the on state light intensity must be large enough to cause a measurable change in the substrate electrical conductivity compared to its thermal equilibrium value. The amount of light intensity absorbed per unit area of the water surface determines, the condition of photo-excited semiconductor. Depending on the substrate doping concentration, there is a threshold light intensity beyond which the high-level injection (HLI) condition is met. For light intensities smaller than the threshold intensity value, the excited semiconductor material is in the low-level injection (LLI) condition. The process control computer can control and adjust the on-state lamp intensity level during the initial condition. In general, the LLI condition results in relatively small variations or modulation depths in the conductivity and microwave reflectance parameters causing small detected signal levels and requiring more sensitive electronics. The LLI condition, however, is preferred if absolute measurements of the trap-related (so-called SRH generation/recombination centers) minority-carrier lifetime is desired. On the other hand, the HLI condition provides fairly large variations or modulation depths in the electrical conductivity and microwave reflectance signals resulting in large detected signals. The HLI condition, however, results in an effective excess minority carrier lifetime which is a complex function of various physical phenomena including the SRH trap centers, Aujer recombination, and other factors. The HLI does not provide absolute measurement of the true minority-carrier lifetime (corresponding to the LLI condition); however, it can be used for qualitative and comparative evaluations of the substrate material quality. The process control computer 76 can control the mode of operation (LLI during the initial self-calibration period).

Plot 2 shows how chopped light source 102 affects the semiconductor substrate conductivity. Initially, with the light source off substrate conductivity exists at some level $\sigma_0$ (thermal equilibrium). After the light source turns on the electrical conductivity will rise to a photo-excited level $\sigma_1$. The substrate conductivity at this point, rises rapidly, although, not instantaneously. Associated with this rise is a small rise time constant, $\sigma_r$, which is primarily determined by the lamp speed. The rate of rise is determined by the turn-on time constant of the lamp source. Cold lamps such as LE and plasma arc lamps can be chopped or turned on and off very rapidly. After the initial rise, the electrical conductivity of the semiconductor wafer levels to a new steady-state value $\sigma_1$. The semiconductor substrate conductivity maintains this level as long as the light source 102 remains on. The ratio Delta-$\sigma/\sigma_0$ or $(\sigma_1-\sigma_0)/94$ depends on the excitation condition; it can be as high as 100% or larger under the high-level injection (HLI) condition and is usually much smaller than 100% under the low-level injection (LLI) condition.

Once light source 102 is turned off, the conductivity begins to fall at a rate having a different and much longer fall time constant, $r_f$ (usually $r_f >> \tau_r$) determined by the semiconductor material. After a period of at least five time constants, i.e., $5\tau_f$, the conductivity almost completely returns to the initial thermal equilibrium value of $\sigma_0$. The semiconductor substrate will continue to exhibit this pattern as long as light source 102 continues to oscillate between the on and off state. It should be emphasized that the lamp source 102 can be switched between two different intensity levels $I_0$ and $I_1$, where $I_0 > I_1$ and $I_0 > 0$ is not a complete off condition. Under this condition, the substrate conductivity is modulated between $\sigma_0$ and $\sigma_1$, where both of these conductivity values are larger than the thermal equilibrium value corresponding to the lamp-off condition.

A limiting parameter in stabilizing the electrical conductivity to its thermal equilibrium level $\sigma_0$ is the time constant, $\tau_f$. The amount of time that it takes for the conductivity to return to $\sigma_0$ from $\sigma_1$ following the removal of photon energy from the semiconductor wafer surface directly relates to semiconductor substrate quality and purity and the concentration of dopants such as boron or phosphorus as well as unwanted metallic impurities. Thus, the time constant, $\tau_f$, changes with changes in purity and with the presence of dopants and other impurities in the substrate. In a impure substance, $\tau_f$ could be very small value, for example, on the measure of microseconds or hundreds of nanoseconds. On the other hand be up to milliseconds, or even seconds in some cases. In order to ensure that the substrate conductivity returns to the thermal equilibrium level, $\sigma_0$, the off period for the light source should at least equal 5 times $\tau_f$. For a fixed on-period length, this determines the duty cycle of the chopping signal which produces the patterns that Plots 1 and 2 show for the light source and conductivity, respectively.

Generally, the semiconductor substrate surface layer generates the electron-hole pairs at the semiconductor wafer surface closest to light source 102, but the excess photo-generated pairs diffuse throughout the rest of the substrate. As the pairs diffuse through the semiconductor substrate, gradients of electrons and holes appear within the substrate. Thus, at the semiconductor wafer 20 surface closest to light source 102, an electron-hole pair generation region exists; at the semiconductor wafer 20 surface opposite the light source 102 an electron-hole pair recombination region exits. Moving from the generation region to the recombination region decreasing levels of photo-generated carriers appear. By scanning the microwave frequency between 10-30 GHz, sensor system 50 of the present invention may disclose these gradients and be used for lifetime profiling. Higher frequencies reveal the surface characteristics such as surface recombination velocity whereas lower microwave probe frequencies can provide more information about bulk recombination.

Plot 3 shows the effect of the changing substrate conductivity on the microwave reflectance from semiconductor wafer 20. Plot 3 begins at a measured microwave reflectance, $R_0$, that corresponds with the semiconductor wafer 20 thermal equilibrium (or a smaller steady-state) conductivity level, $\sigma_0$, with light source 102 turned off (or set at a lower intensity value $I_0$). Changes in the electrical conductivity increase the microwave reflectance from semiconductor wafer 20 and, therefore, affect the reflectance measurements from the semiconductor wafer 20. Following the rise in conductivity to level $\sigma_1$, the microwave reflectance rises to the level $R_1$. Microwave reflectance will maintain the level $R_1$ as long as photo-induced electrical conductivity remains at level $\sigma_1$ for a constant substrate temperature.

Following removal of the photon energy by turning off light source 102 (or reducing the light intensity from a higher intensity level $I_1$ to a lower intensity level $I_0$), the conductivity begins to fall due to the recombination of electron-hole pairs. In response to a fall in conductivity to the level $\sigma_0$, the microwave reflectance of semiconductor wafer begins to fall to a new steady-state level, $R_0$. The rate at which the microwave reflectance falls depends on the time constant, $\tau_f$, that determines the rate at which substrate conductivity falls from $\sigma_1$ $\sigma_0$. The transient time associated with the change in reflectance level directly depends on the time constant, $\tau_f$, therefore, the modulation of microwave reflectance can produce a high resolution $\tau_f$ or excess minority carrier lifetime measurement. Plot 3 of FIG. 6 assumes that the decay of the microwave reflectance is exponential based on a single lifetime in the low-level injection or weak high-level level injection regime. For a given difference between $\sigma_1$ and $\sigma_0$, i.e. o, this assumption may not be accurate. For this assumption to be accurate, the microwave reflectance must depend linearly on factors that vary silicon substrate conductivity. In such case, the time constant for microwave reflectance decay will be the same as the time constant, $r_f$, for substrate conductivity. Usually, a small Delta-$\sigma$ value (e.g., Delta-$\sigma << \sigma_0$) a linear dependence of microwave reflectance on conductivity may be assumed. This is the low-level injection condition for the photo-excited semiconductor.

If this is not the case, it generally is possible to establish a small enough range between $\sigma_0$ and $\sigma_1$ where the relationship between conductivity and microwave reflectance variations is at least piece-wise linear. In the region where photo-conductivity and microwave reflectance variations have piece-wise linear dependence, the lifetime of the excess carriers, $\tau_f$, determines the time that it takes for microwave reflectance to return to the dark semiconductor wafer 20 reflectance level corresponding to the lower lamp intensity level, $I_0$. This makes the microwave reflectance fall exponentially with a time constant equal to $\tau_f$. With measurement of microwave reflectance in these types of regions, it is possible to calculate the silicon substrate lifetime and determine its quality and/or purity.

There are two ways that light source 102 can make the range between $\sigma_0$ and $\sigma_1$ small enough so that the relationship between microwave reflectance and conductivity variations is at least piece-wise linear. One way is to make the on-state intensity of the light source small enough to prevent high-level injection, but at least above a level to cause measurable conductivity modulation in the substrate. The other way is to make the lamp off-state correspond to a lower intensity level. In this situation, the difference between $R_0$ and $R_1$ would intensity state, $I_1$, for the light source and a high-intensity on state for the light source, respectively (both states will be different from the thermal equilibrium state), which is the thermal equilibrium condition with the lamp off.

Certain constraints relate to the difference between the high and low intensity levels in both of the above methods of operating in a region where microwave reflectance and conductivity variations have at least piece-wise linear dependence. On one hand, the difference between the high (on-state) and low (off-state) intensity levels must be small enough that the assumption of piecewise linear behavior is appropriate. On the other hand, the difference between the two intensity levels (Delta-I $=I_1-I_0$) must be large enough to provide a measurable signal and sufficient signal-to-noise and measurement accuracy level for accurate microwave reflectance and substrate lifetime measurements. These issues are also related to the modulated depth and mode of photo-generation (LLI and HLI) considerations.

Another contributor to the semiconductor wafer electrical conductivity is the substrate temperature. In fact, in the absence of light source 102, effects from changes in temperature may dominate changes in the pure substrate conductivity. With dopants in the semiconductor substrate, substrate conductivity increases. However, even for heavily doped substrates, as temperature increases beyond a threshold value, the effect of substrate doping becomes less important and temperature effects begin to dominate substrate conductivity measurements. The thermally generated carriers can make the semiconductor material intrinsic, implying that the substrate conductivity is essentially dominated by the thermally generated carriers and little affected by the background doping. Therefore, the apparatus of the present invention is also useful for determining the semiconductor substrate temperature during a device fabrication process.

As a result of light source 102 in combination with sensor system 50 and process control computer 76, the present invention can determine accurately the substrate conductivity level as well as the minority carrier lifetime. A given dopant level produces a given effect on substrate conductivity. The substrate background doping can be determined by a room-temperature conductivity measurement using the sensor system 50. With higher temperatures in the cleaning reactor, however, the conductivity of the silicon substrate will change further. Substrate conductivity measurements (via microwave reflectance measurements) at higher temperatures can be used to extract the precise substrate temperatures, assuming that the substrate doping is determined by an initial room-temperature measurement. Thus, with the preferred embodiment of the present invention, it is possible to accurately determine the effect on steady-state electrical conductivity of different wafer temperatures or, conversely, the substrate temperature for a known dopant level.

Figure 7:
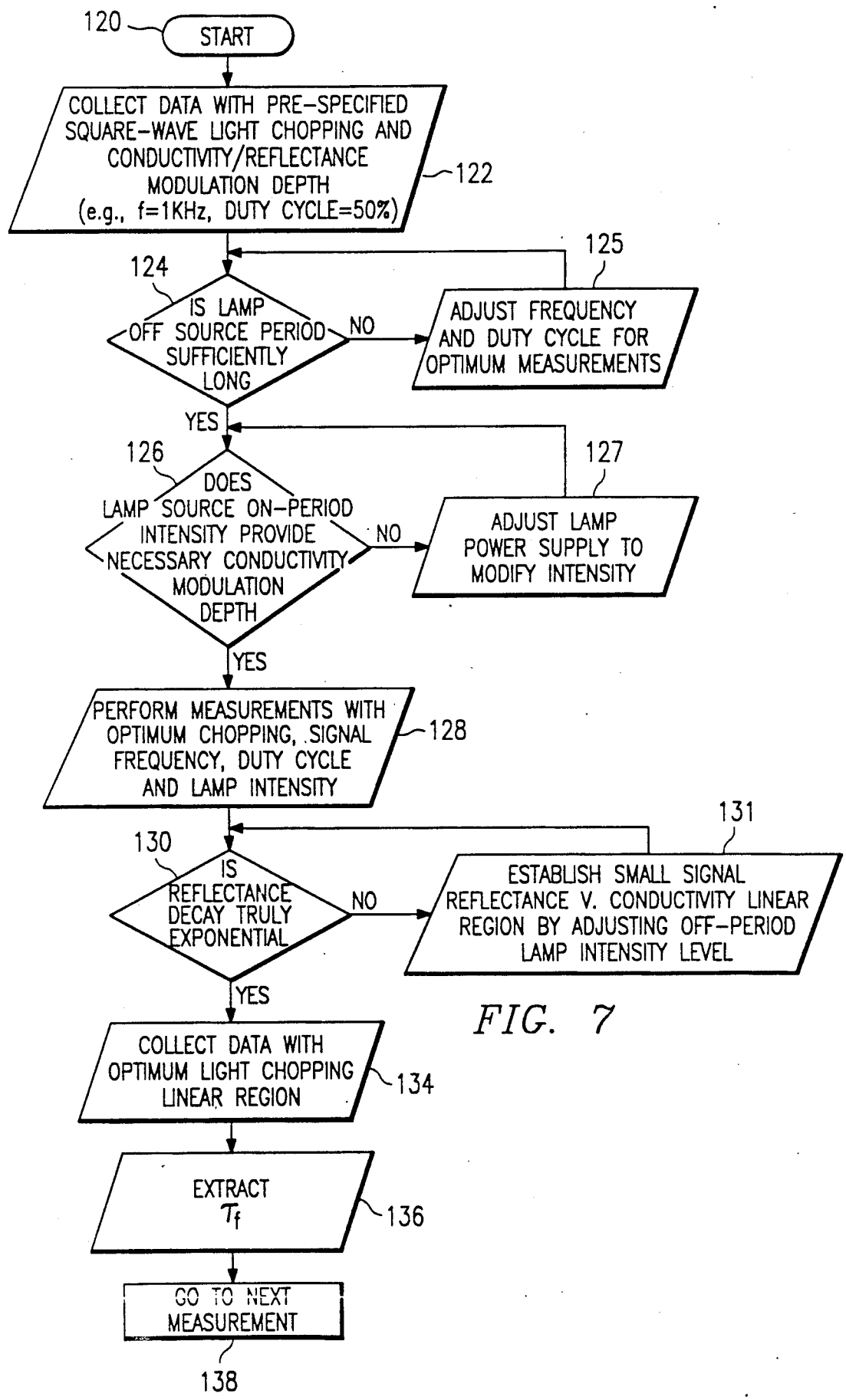
FIG. 7 provides a representative flow diagram of the sensor process controls and calculations of the present invention that determine semiconductor substrate quality from chopped light microwave reflectance/transmittance measurements.

FIG. 7 provides a flow diagram of the process controls and calculations that process control computer 76 executes to determine semiconductor substrate minority-carrier lifetime from chopped light microwave reflectance measurements of semiconductor wafer 20. Controls that process control computer 76 may execute include the following:

(1) controlling the duty cycle and frequency of the light source 102. This ensures that the off time (or the time period at a lower intensity Ie) for light source 102 is at least five time the minority-carrier lifetime so that conductivity returns to thermal equilibrium $\sigma_0$ (or its lower steady-state value) after light source 102 is turned off (or is switched to lower intensities, $I_0$);

(2) adjusting the light intensity difference between the light source 102 on and off (Delta-I$=I_1-I_o$) states to eliminate functional non-linearities. This adjustment ensures that microwave reflectance exponentially decays in accordance with the time constant upon the removal of photon energy;

(3) checking to ensure that the difference between light source 102 low intensity or off state and the microwave reflectance high intensity or on state (Delta-I$=I_1-I_o$) is sufficiently large to produce a measurable signal and a satisfactory signal-to-noise ratio for sensor system 50. Steps (2) and (3) also determine the photo-generation process and the injection condition (LLI or HLI) in semiconductor substrate.

(4) calculating the time constant, $\tau_f$, from the microwave reflectance decay measurements. The time constant $\tau_f$ determines the semiconductor substrate purity and quality (minority-carrier lifetime).

In determining the proper off time for the purpose of extracting $\tau_f$, process control computer 76 initially starts in an adaptive self-calibration mode. Process control computer 76 first collects data with prespecified square wave chopping, for instance, at a frequency of 1 KHz and a duty cycle of 50%. Process control computer, then determines if the off period for the light source is sufficiently long for accurate $\tau_f$ calculations. If the off period is not sufficiently long, then process control computer 76 will increase the off period based on a pre-specified algorithm until process control computer 76 determines that the off period equals least 5 times $\tau_f$, or larger (resulting in achieving the steady-state condition at the end of the off-period state).

Process control computer 76 may also determine whether microwave reflectance measurements define an exponentially falling curve upon the removal of photon energy from light source 102. In making this determination, process control computer 76 tests if a linear relationship exists between microwave reflectance and conductivity changes. If the relationship is not linear, the computer examines whether the microwave reflectance and conductivity changes have a piece-wise linear region for small variations. This condition can usually be satisfied for sufficiently small conductivity and microwave reflectance modulations. Process control computer 76 will reduce the difference, Delta-$\sigma$, or modulation depth between the on and off states (or the low and high intensity states) of the light source 102 to eliminate the Delta-R to Delta-σ functional non-linearity for small-signal variables. The conductivity modulation depth Delta-o caused by the light chopping action (Delta-I = I₂I₁) should be made large enough to provide sufficiently large and measurable microwave reflectance variations (Delta-R = R₁ − R₀).

After adjusting light source 102 intensity levels, process control computer 76 again collects microwave reflectance data. Based on this data, process control computer 76 will extract $\tau_f$ for the semiconductor wafer 20 at the initial substrate temperature. As temperature varies during a fabrication process, additional measurements ensue. Once process control computer 76 extracts $\tau_f$, known calculations can determine semiconductor substrate quality or contamination level.

An alternative embodiment of the present invention may be implemented in load lock or metrology, chamber 15 (not shown), similar to the reactor process chamber 18, itself. An embodiment of sensor system 50 together with light source 102 in the load lock can take measurements at room temperature (shown in FIG. 2). Pre-process and post-process measurements are useful to examine the effects of a device fabrication process such as wafer cleaning or reactive-ion etching on substrate materials quality as reflected by lifetime measurements. These measurements are useful, for instance, to determine the effectiveness of a substrate cleaning process or detrimental effects of a plasma etch process on the substrate material quality.

Figure 8:
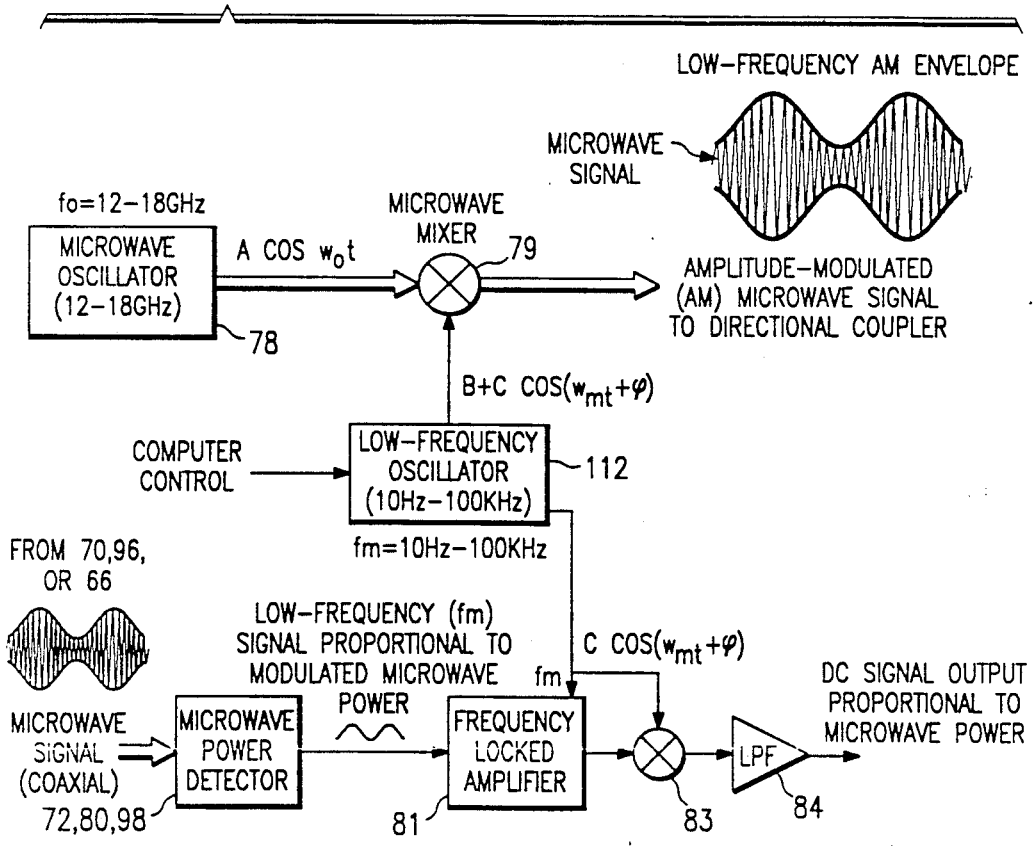
FIG. 8 shows an alternative embodiment of the present invention that eliminates the effects of DC voltage drifts and noise in sensor system output by using an amplitude-modulated (AM) microwave signal and subsequent detection of the envelop signal as a measure of detected microwave power.

FIG. 8 shows an alternative embodiment of the present invention an enhancement to the sensor in FIGS. 1 and 2) that eliminates the effects of noise and DC voltage drift in microwave sensor system 50 on its outputs to process control computer 76. In the normal operational mode of the present invention, light source 102 provides a chopped photon energy source to semiconductor wafer 20. The sensor system 50 sends measured DC voltage signals to the A/D converters (e.g., 74, 82, 10) to prepare digitized data for input to the process control computer 76. However, these measure DC signals, representing the microwave power levels in the transmitting and receiving waveguide arms, are subject to detrimental effects of noise and voltage drift.

To eliminate the effects of noise and DC voltage drifts and to improve sensor reproducibility and signal-to-noise ratio for minority-carrier lifetime measurement, FIG. 8 describes the use of an amplitude modulation (AM) enhancement of the microwave probe signal from the microwave signal source 78. By mixing (using a mixer 79) a signal of between 10 Hz and 100 KHz from a low frequency oscillator 112 upon the 12 GHz microwave probe signal from microwave oscillator 78 of the preferred embodiment, an amplitude modulated microwave signal is obtained at the output of the mixer 79. Miler 79 essentially multiplies the 12 GHz microwave signal [which may be represented as $A^*\cos(w_o t)$] from microwave source 78 of the preferred embodiment by a lower frequency AC signal [e.g., $B + C^*\cos(w_1 t + \phi)$] from low frequency oscillator 112. This operation yields an amplitude modulated probe signal that is guided by the emitter waveguide 52 directs toward semiconductor wafer 20.

In measuring the incident, reflected, and collected microwave signal power levels, microwave power detectors, for example, crystal detectors 72, 80, or 98 generates an alternating voltage signal to frequency-locked (or lock-in) amplifier 81. Lock-in amplifier 81 locks on the amplitude modulation frequency (or the AC portions of the detector output signals) and provides an amplified AC signal at its output proportional to the AC component of the detector signal. For the sensor system 50 shown in FIG. 1, a 3-channel lock-in amplifier will be required. The amplified output of frequency locked a plifier 81 is an AC signal that is free of the effects or noise and DC voltage drifts. The noise and DC voltage drift effects are suppressed and will not be amplified by the lock-in amplifier 81. Frequency locked amplifier 81 provides an AC output (with frequency modulation) which is then fed to a mixer 83 (to be multiplied by the low-frequency oscillator 112 output signal) and then a low-pass filter 87. This configuration will provide a DC out-ut signal proportional to the AC microwave power detected by each crystal detector. An example of the frequence locked amplifier 8 may be, for example, a phase-locked loop (PLL).

The result of using amplitude modulation and frequency-locked amplifier 81 is an increase of signal-to-noise ratio and improved measurement repeatability. This also eliminates the possible signal drifts inherent in steady-state DC signals obtained from the microwave reflectance measurements. This AM enhancement scheme produces more accurate chopped-light microwave reflectance measurements that accurately represent conductive properties of semiconductor wafer 20. This is because lock-in amplifier locks on one specific frequency, i.e., the modulation frequency and disregards or suppresses the noise and DC drift effects. Frequency locked amplifier will amplify only the signal with frequency modulation. Thus, by amplitude modulation, the enhancement feature of FIG. 8, comprising in alternative embodiment of the present invention, provides more accurate and reproducible measurements of semiconductor wafer 20. It should be emphasized that the sensor performance enhancement feature of FIG. 8 must be implemented for each detector channel. As a result, the sensor system 50 of FIGS. 1 and 2, having three or four crystal detectors will require a lock-in amplifier with three or four amplification channels and as many mixers and lock-in amplifier channels. These channels, however, are essentially identical to the configuration that FIG. 8 shows.

Although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. An apparatus for semiconductor substrate minority carrier lifetime measurements of a wafer, comprising:

a signal source for generating electromagnetic waves;

a microwave emitter spaced a selected distance from said substrate for emitting said electromagnetic waves toward said substrate and a microwave detector spaced from said substrate for detecting a portion of said electromagnetic waves that reflect from said substrate;

a generator for generating a first set of signals in response to said emitted electromagnetic waves and for generating a second set of signals proportional to said detected electromagnetic waves;

an energy source for emitting photon energy toward the substrate; and measuring circuitry for measuring said first and second sets of signals into substrate characteristics measurements and for measuring the associated substrate response to said phonton energy.

2. The apparatus of claim 1, wherein said electromagnetic waves have a frequency range bounded by a lower frequency and an upper frequency, said lower frequency producing a signal wavelength that is small relative to the dimensions of the wafer and said upper frequency providing for optimal measurement sensitivity to electromagnetic wave interaction with the wafer substrate.

3. The apparatus of claim 1, wherein said signal source comprises a low frequency source capable of frequency scanning.

4. The apparatus of claim 1, further comprising a microwave signal chopper within said signal source for chopping said electromagnetic waves to improve signal-to-noise ratios for said detected electromagnetic waves.

5. The apparatus of claim 1, wherein said microwave detector comprises a separate collector waveguide for collecting a portion of said electromagnetic waves.

6. The apparatus of claim 1, further comprising circuitry for microwave signal amplitude modulation to improve signal-to-noise ratios and minimize signal drift for said detected electromagnetic waves.

7. An apparatus for semiconductor substrate carrier lifetime measurements, comprising:

an electromagnetic signal source for generating electromagnetic waves;

at least one waveguide terminating a selected distance from said substrate in communication with said electromagnetic signal source for emitting said electromagnetic waves toward the wafer and for detecting a portion of electromagnetic waves returning from the wafer, at least one coupler in communication with said at least one waveguide for generating a plurality of signals, said plurality of signals comprising an emitted set of signals proportional to the power of said electromagnetic waves and for generating a set of signals proportional to the power of said portion of said electromagnetic waves reflected from said substrate;

a photon energy source for intermittently emitting phonton energy in the direction of the said substrate; and measuring circuitry in communication with said coupler for receiving said plurality of signals and converting said signals into wafer electromagnetic wave reflectance measurements and in communication with said photon energy source for relating said intermittent photon energy to said electromagnetic wave reflectance measurements.

8. The apparatus of claim 7, wherein said electromagnetic waves have a frequency range bounded by a lower frequency and an upper frequency, said lower frequency producing a signal wavelength that is small relative to the dimensions of the wafer and said upper frequency providing for optimal measurement sensitivity to electromagnetic wave interaction with the wafer.

9. The apparatus of claim 7, wherein said electromagnetic signal source comprises a low frequency source capable of frequency scanning.

10. The apparatus of claim 7, further comprising a microwave signal chopper within said electromagnetic signal source for chopping said electromagnetic waves to improve signal-to-noise ratios for said reflected electromagnetic waves.

11. The apparatus of claim 7, wherein said emitter waveguide further comprises a microwave transmitter for transmitting said electromagnetic waves and a microwave detector for detecting said reflected electromagnetic waves.

12. The apparatus of claim 7, further comprising circuitry for microwave signal amplitude modulation to improve signal-to-noise ratios and minimize signal drift for said detected electromagnetic waves.

13. The apparatus of claim 8, further comprising, a collector waveguide for collecting a portion of said reflected electromagnetic waves.

14. The apparatus of claim 13, wherein said at least one coupler comprises a gallium arsenide amplifier for communicating among said electromagnetic wave source, said collector waveguide, and said measuring circuitry.

15. The apparatus of claim 7, wherein said at least one coupler comprises a dual directional coupler for communicating among said electromagnetic wave source, said emitter waveguide, and said measuring circuitry.

16. The apparatus of claim 7, further comprising a plurality of detectors for measuring a predetermined aspect of said portion of electromagnetic waves.

17. The apparatus of claim 7, wherein said photon energy source comprises a light source capable of dispersing a photon energy at least equal in level to the band gap energy of the wafer substrate.

18. The apparatus of claim 7, wherein said photon energy source comprises a light source capable of dispersing a photon energy having a wavelength not greater than one micron.

19. The apparatus of claim 7, wherein said measuring circuitry comprises a process control computer for calculating wafer electromagnetic wave reflectance measurements as a function of said emitted and reflected electromagnetic waves.

20. The apparatus of claim 19, wherein said process control computer includes necessary data and instructions for converting electromagnetic wave reflectance measurements into substrate conductivity measurements.

21. The apparatus of claim 20, wherein said process control computer includes necessary data and instructions for converting electromagnetic wave reflectance measurements into substrate conductivity measurements and for relating said intermittent photon energy signals and said substrate conductivity measurements to substrate carrier lifetime measurements.

22. The apparatus of claim 21, wherein said process control computer further controls said photon energy source intermittent operation and said data and instructions further comprise controls that de-energize said photon energy source for period sufficiently to permit said electromagnetic wave reflectance measurements to return to thermal equilibrium levels following deenergizing said photon energy source.

23. The apparatus of claim 22, wherein said process control computer further controls said photon energy source energy level and said data and instructions further comprise calculate proper photon energy source levels to ensure a linear relationships between electromagnetic wave reflectance measurements and substrate conductivity as said electromagnetic wave reflectance measurements return to thermal equilibrium levels following de-energizing said photon energy source.

24. The apparatus of claim 21, wherein said process control computer includes necessary data and instructions for converting electromagnetic wave reflectance measurements into substrate conductivity measurements and for relating said intermittent photon energy signals and said substrate conductivity measurements to substrate carrier lifetime measurements.

25. The apparatus of claim 24, further comprising a plurality of look-up tables for converting said electromagnetic wave reflectance measurements into substrate purity levels.

26. The apparatus of claim 25, further comprising a plurality of look-up tables for converting said electromagnetic wave reflectance measurements into substrate dopant levels.

27. The apparatus of claim 26, wherein said electromagnetic signal source comprises a low frequency source capable of frequency scanning and said process control computer further comprises necessary data and instructions to perform substrate doping profile measurements.

28. The apparatus of claim 21, further comprising a plurality of look-up tables for converting said electromagnetic wave reflectance measurements into wafer temperature measurements.

29. The apparatus of claim 7, wherein said apparatus is configured within a cleaning reactor for removing contaminants from the wafer substrate and wherein said measuring circuitry comprises a process control computer, said process control computer comprising necessary data and instructions for converting electromagnetic wave reflectance measurements into substrate conductivity measurements and for relating said intermittent photon energy signals and said substrate conductivity measurements to substrate carrier lifetime measurements.

30. The apparatus of claim 7, wherein said apparatus is configured within a cleaning reactor load lock for removing contaminants from the wafer substrate and wherein said measuring circuitry comprises a process control computer, said process control computer comprising necessary data and instructions for converting electromagnetic wave reflectance measurements into substrate conductivity measurements and for relating said intermittent photon energy signals and said substrate conductivity measurements to substrate carrier lifetime measurements.

31. The apparatus of claim 7, wherein said apparatus is configured within a metrology chamber for performing associated processes with the wafer and wherein said measuring circuitry comprises a process control computer, said process control computer comprising necessary data and instructions for converting electromagnetic wave reflectance measurements into substrate conductivity measurements and for relating said intermittent photon energy signals and said substrate conductivity measurements to substrate carrier lifetime measurements.

32. An apparatus for wafer substrate carrier lifetime measurements, comprising:
an electromagnetic wave source for generating electromagnetic waves and comprising a low-power microwave signal source capable of frequency scanning and a microwave signal chopper for chopping said electromagnetic waves;
a waveguide in communication with said electromagnetic wave source and terminating a selected distance from the substrate, said waveguide comprising a microwave transmitter for transmitting said electromagnetic waves toward the wafer and a microwave detector for detecting a predetermined aspect of said electromagnetic waves reflected from the wafer, said electromagnetic waves having a frequency range bounded by a lower frequency and an upper frequency, said lower frequency bounded by a lower frequency and an upper frequency, said lower frequency producing a signal wavelength that is small relative to the dimensions of the wafer and said upper frequency providing for optimal measurement sensitivity to electromagnetic wafer interaction with the substrate;
a dual directional coupler for communicating among said electromagnetic wave source and said electromagnetic wave source and said emitter waveguide, said dual directional coupler comprising measuring circuitry for generating a plurality of signals, said plurality of signals comprising an emitted set of signals proportional to the power of said electromagnetic waves and a reflected set of signals proportional to the power of said portion of said reflected electromagnetic waves, said plurality of signals from said at least one coupler being directly related to measurements of the wafer substrate;
a photon energy source for intermittently emitting photon energy in the direction of the wafer, said photon energy source comprising a light source capable of dispersing a photon energy level at least equal in level to the band gap energy of the wafer substrate and having a wavelength not greater than one micron;
a process control computer in communication with said dual directional coupler and said photon energy source for calculating said electromagnetic wave reflectance measurements as a function of said emitted and reflected electromagnetic waves in conjunction with said photon energy level dispersing; and
a plurality of look-up tables set within said process control computer for converting wafer electromagnetic wave reflectance measurements into substrate conductivity measurements.

33. The apparatus of claim 32, wherein said plurality of look-up tables comprises a set of look-up tables for converting said reflectance measurements into substrate dopant level measurements.

34. A method for performing substrate carrier lifetime measurements, comprising:
spacing a source of electromagnetic waves and a substrate to be measured at a selected distance from each other;
emitting said electromagnetic waves toward said substrate;
intermittently emitting photon energy toward said substrate;
detecting a portion of said electromagnetic waves reflected from said substrate within a deposition chamber;
generating a plurality of signals to form an emitter set of signals proportional to said electromagnetic waves and a reflected set of signals proportional to said portion of said reflected electromagnetic waves, said plurality of signals being directly related to the wafer conductive layer measurements; and converting said plurality of signals into wafer conductive layer measurements.

35. The method of claim 34, further comprising the step of chopping said electromagnetic waves.

36. The method of claim 34, wherein said step of generating a plurality of signals further comprises the step of producing DC voltages proportional to said emitted set of signals and said reflected set of signals.

37. The method of claim 34, wherein said detecting step further comprises the step of detecting said portion of reflected electromagnetic waves at different deposition process temperatures.

38. The method of claim 24, further comprising the step of converting said plurality of signals to substrate dopant levels.

39. The method of claim 34, wherein said converting step further comprises the step of converting said plurality of signals into wafer temperature measurements.

40. The apparatus of claim 1 wherein said selected distance is about 30 mm.

41. The apparatus of claim 1 wherein said electromagnetic waves have a frequency range of between about 10 and 30 GHz.

42. The apparatus of claim 7 wherein said selected distance is about 30 mm.

43. The apparatus of claim 7 wherein said electromagnetic waves have a frequency range of between about 10 and 30 GHz.

44. The apparatus of claim 32 wherein said selected distance is about 30 mm.

45. The apparatus of claim 32 wherein said electromagnetic waves have a frequency range of between about 10 and 30 GHz.

46. The method of claim 34 wherein said source and said substrate are spaced apart by about 30 mm.

47. The method of claim 34 wherein said electromagnetic waves are emitted at a frequency between about 10 and 30 mm.

* * * * *